(12) United States Patent
Dai et al.

(10) Patent No.: US 9,768,306 B2
(45) Date of Patent: Sep. 19, 2017

(54) ARRAY SUBSTRATE AND DISPLAY DEVICE

(71) Applicant: BOE Technology Group Co., Ltd., Beijing (CN)

(72) Inventors: Tianming Dai, Beijing (CN); Qi Yao, Beijing (CN); Feng Zhang, Beijing (CN); Zhangfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/151,396

(22) Filed: May 10, 2016

(65) Prior Publication Data

US 2017/0243979 A1    Aug. 24, 2017

Related U.S. Application Data

(62) Division of application No. 13/981,165, filed as application No. PCT/CN2012/084698 on Nov. 15, 2012, now Pat. No. 9,368,635.

(30) Foreign Application Priority Data

Mar. 8, 2012    (CN) .......................... 2012 1 0060352

(51) Int. Cl.
*H01L 29/10* (2006.01)
*H01L 29/786* (2006.01)
(Continued)

(52) U.S. Cl.
CPC ...... *H01L 29/78606* (2013.01); *H01L 27/127* (2013.01); *H01L 27/1225* (2013.01);
(Continued)

(58) Field of Classification Search
CPC .... H01L 29/78606; H01L 29/22; H01L 29/45
(Continued)

(56) References Cited

U.S. PATENT DOCUMENTS

| 2008/0135909 A1 | 6/2008 | Takeguchi et al. |
| 2009/0278131 A1 | 11/2009 | Kwon et al. |

(Continued)

FOREIGN PATENT DOCUMENTS

| CN | 102214700 A | 10/2001 |
| CN | 101196668 A | 6/2008 |

(Continued)

OTHER PUBLICATIONS

International Search Report for International Application No. PCT/CN2012/084698, 16pgs.
(Continued)

*Primary Examiner* — Jami M Valentine

(57) ABSTRACT

An array substrate and a display device are provided. A gate insulating layer and a gate electrode are formed on a semiconductor layer in sequence, the gate insulating layer and the gate electrode are located in a middle position of the semiconductor layer and have a uniform shape and size. In a region on the semiconductor layer that is not covered by the gate insulating layer, there is further provided a metal diffusion layer. A barrier layer includes a portion covering the gate insulating layer and the gate electrode and a portion located around the semiconductor layer. A passivation layer covers the semiconductor layer, the gate insulating layer, the gate electrode and the barrier layer. Source and drain electrodes are connected to the metal diffusion layer respectively, and a pixel electrode contacts with the drain electrode.

7 Claims, 5 Drawing Sheets

(51) Int. Cl.
H01L 29/22 (2006.01)
H01L 29/24 (2006.01)
H01L 27/12 (2006.01)

(52) U.S. Cl.
CPC .......... *H01L 27/1288* (2013.01); *H01L 29/22* (2013.01); *H01L 29/24* (2013.01); *H01L 29/7869* (2013.01); *H01L 29/78696* (2013.01)

(58) Field of Classification Search
USPC .......................................................... 257/43
See application file for complete search history.

(56) References Cited

U.S. PATENT DOCUMENTS

| | | | |
|---|---|---|---|
| 2010/0270556 A1 | 10/2010 | Wang et al. | |
| 2011/0240998 A1 | 10/2011 | Morosawa et al. | |
| 2013/0032794 A1* | 2/2013 | Lee | H01L 29/45 257/43 |
| 2014/0070206 A1* | 3/2014 | Dai | H01L 29/66969 257/43 |
| 2015/0214320 A1* | 7/2015 | Liu | H01L 29/45 257/43 |
| 2016/0197192 A1* | 7/2016 | Kang | H01L 29/7869 257/43 |

FOREIGN PATENT DOCUMENTS

| | | |
|---|---|---|
| CN | 101577283 A | 11/2009 |
| CN | 1012023401 A | 4/2011 |
| CN | 102208452 A | 10/2011 |
| CN | 102244034 A | 11/2011 |

OTHER PUBLICATIONS

First Office Action for Chinese Patent Application No. 2012100603527 dated Aug. 20, 2013, 6pgs.
English Translation of First Office Action for Chinese Patent Application No. 2012100603527, 3 pgs.
International Preliminary Report on Patentability for International Application No. PCT/CN2012/084698 dated Sep. 9, 2014, 21pgs.

\* cited by examiner

ARRAY SUBSTRATE AND DISPLAY DEVICE

CROSS REFERENCE TO RELATED APPLICATIONS

This application is Divisional of U.S. patent application Ser. No. 13/981,165, filed Jul. 23, 2013, which is a 371 of PCT International Application No. PCT/CN2012/084698, filed Nov. 16, 2012, which claims priority to Chinese National Application No. 201210060352.7, filed Mar. 8, 2012. The entire contents of each and every foregoing application are incorporated herein by reference.

TECHNICAL FIELD

Embodiments of the present invention relate to an array substrate, a method for manufacturing the same, and a display device.

BACKGROUND

Indium Gallium Zinc Oxide (IGZO) has become a research hotspot about oxide semiconductor materials at present, and its carrier mobility can reach up to 10 cm/Vs, which is above ten times larger than that of amorphous silicon. As for the panels of a large area and the panels of ultra-precision, it is possible that the response speed is increased favorably and the size of Thin Film Transistors (TFTs) is decreased with application of this material. Currently, this material has been widely used in Organic Light-Emitting Diode (OLED) display or Liquid Crystal Display (LCD). However, IGZO material is susceptible to external conditions such as water vapour, oxygen, etc., and this leads to degrades in material characteristics.

As to typical back panels (i.e., array substrates), what are currently in mass production are mainly of Low Temperature Poly Silicon (LTPS) and they have been in mass production by Samsung Corporation, but it is necessary that a great deal of modification be conducted upon existing equipments and investment on equipments be increased owing to the application of an ELA process. OLED back panels employing oxide semiconductor materials mostly adopt a top-gate structure, and impact of a source-drain (SD) etching solution on IGZO material can be avoided by using an etch stop layer technology. The number of mask processes (or a patterning processes) in the method of manufacturing the array substrate is usually six to seven.

SUMMARY

According to embodiments of the invention, it is possible that the number of a mask process is decreased, and the process cost is reduced.

In an aspect of the invention, there is provided a manufacturing method of an array substrate, comprising the following steps:

S1: forming a pattern comprising a semiconductor layer, a gate insulating layer, a gate electrode and a gate line on a substrate;

S2: on the substrate subjected to the step S1, forming a metal diffusion layer on the pattern of the semiconductor layer which is not covered by the gate insulating layer and forming a barrier layer in other regions;

S3: forming a passivation layer on the substrate subjected to the step S2; and

S4: forming a pattern of via holes, source and drain electrodes, a data line and a pixel electrode on the passivation layer, the source and drain electrodes being which being connected to the metal diffusion layer through the via holes respectively.

In the method, for example, the step S1 may include:

forming an oxide semiconductor thin film on the substrate;

coating photoresist on the oxide semiconductor thin film, conducting an exposure and development treatment on the photoresist with a mask plate, so that the photoresist in a region of the pattern of the semiconductor layer is retained, etching off the oxide semiconductor thin film that is exposed, and removing the retained photoresist so as to form the pattern of the semiconductor layer;

forming an insulating thin film and a gate metal thin film in sequence on the substrate with the pattern of the semiconductor layer formed thereon;

coating photoresist on the gate metal thin film, conducting an exposure and development treatment on the photoresist with a mask plate, so that the photoresist in a region of the pattern of the gate insulating layer, the gate electrode and the gate line is retained, and etching off the gate metal thin film that is exposed, so as to expose the insulating thin film; and etching off the insulating thin film that is exposed by means of dry etching, and removing the retained photoresist, so as to form the pattern of the gate insulating layer, the gate electrode and the gate line;

In the method, for example, the step S1 may include:

forming an oxide semiconductor thin film, an insulating thin film and a gate metal thin film on the substrate in sequence;

coating photoresist on the gate metal thin film, conducting an exposure and development treatment on the photoresist with a double-tone mask plate, so that the photoresist in a region of the pattern of the metal diffusion layer and in a region of the pattern of the gate insulating layer, the gate electrode and the gate line is retained, and a thickness of the photoresist in the region of the pattern of the metal diffusion layer is smaller than that of the photoresist corresponding to the region of the pattern of the gate insulating layer, the gate electrode and the gate line, removing the photoresist in remaining regions;

etching off the gate metal thin film, the insulating thin film and the oxide semiconductor thin film in the region where the photoresist is not retained through wet etching, dry etching and wet etching in sequence;

retaining the photoresist in the region of the pattern of the gate insulating layer, the gate electrode and the gate line and removing the photoresist in remaining regions in an ashing process; and etching off the gate metal thin film and the insulating thin film in the region where the photoresist is not retained through wet etching and dry etching in sequence, and removing the retained photoresist, so as to form the pattern of the semiconductor layer, the gate insulating layer, the gate electrode and the gate line.

In the method, for example, a material for the oxide semiconductor thin film may be IGZO or ZnO.

In the method, for example, a thickness of the semiconductor layer may be in the range of 10-5000Å.

In the method, for example, a thickness of the gate insulating layer may be in the range of 200-20000Å.

In the method, for example, the step S2 may include:

depositing a layer of metal thin film by sputtering; and performing annealing in an oxygen atmosphere, so that the metal thin film directly covering pattern of the semiconductor layer diffuses into the pattern of the semiconductor layer to form the metal diffusion layer, and the metal thin film which does not directly cover the pattern of the semiconductor layer is formed to be the metal oxide barrier layer by the annealing.

In the method, for example, a thickness of the metal thin film may be in the range of 20-200Å.

In the method, for example, the metal thin film may be an aluminum thin film.

In the method, for example, the annealing temperature of the aluminum thin film may be in the range of 100-400° C., and the annealing time period is in the range of 20-200 min.

In the method, for example, the step S4 may include:

coating photoresist on the passivation layer, conducting an exposure and development treatment on the photoresist through a double tone mask plate, so as to remove the photoresist in a via hole region and retain the photoresist in a region of the pattern of the source and drain electrodes and the data line;

etching off the exposed passivation layer to form the via holes, so that the metal diffusion layer at the via hole is exposed;

removing the photoresist in the region of the pattern of the source and drain electrodes and the data line through an ashing process, forming a source and drain metal thin film and a pixel electrode thin film in sequence, so that the source and drain metal thin film contacts the metal diffusion layer respectively; and removing the photoresist remaining on the passivation layer and as well the source and drain metal thin film and the pixel electrode thin film attached to the photoresist by means of lifting-off so as to form the pattern of the source and drain electrodes, the data line and the pixel electrode.

In the method, for example, a material for the pixel electrode may be ITO or IZO.

According to the present invention, there is further provided an array substrate, comprising a semiconductor layer, a gate insulating layer, a gate electrode, a barrier layer, a passivation layer, source and drain electrodes, and a pixel electrode, which are all formed on a substrate, wherein the gate insulating layer and the gate electrode are formed on the semiconductor layer in sequence, the gate insulating layer and the gate electrode are located in a middle position of the semiconductor layer and have a uniform shape and size, in a region on the semiconductor layer that is not covered by the gate insulating layer, there is further provided a metal diffusion layer, the barrier layer includes a portion covering the gate insulating layer and the gate electrode and a portion located around the semiconductor layer, the passivation layer covers the semiconductor layer, the gate insulating layer, the gate electrode and the barrier layer, the source and drain electrodes are connected to the metal diffusion layer respectively, and the pixel electrode contacts with the drain electrode.

In the array substrate, for example, the source and drain electrodes may be located on the passivation layer, and connected to the metal diffusion layer through via holes in the passivation layer.

In the array substrate, for example, the semiconductor layer may be a metal oxide semiconductor, such as IGZO, etc.

In the array substrate, for example, the metal diffusion layer may be an Al diffusion layer.

In the array substrate, for example, the barrier layer may be a nonconductive metal oxide.

In the array substrate, for example, the metal oxide may be Al2O3.

According to the present invention, there is further provided a display device, comprising any of the above described array substrate.

With the manufacturing method of the array substrate according to embodiments of the invention, the number of used mask plates can be effectively decreased, and production costs are reduced, and by using an oxide (for example, aluminum oxide) for the barrier layer of the oxide semiconductor, stability of TFTs is enhanced effectively.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical terminology or scientific terminology used herein should have the same meaning as commonly understood by one of ordinary skill in the art to which this invention belongs. Terms "first", "second" and the like used in specification and claims of the patent application of the invention do not show any order, number or importance, but are only used to distinguish different constituent parts. Likewise, a term "a," "an," "the" or the like does not indicate limitation in number, but specifies the presence of at least one. Terms "connection," "connected," or the like are not limited to physical or mechanical connection, but can include electrical connection, whether directly or indirectly. "Upper," "lower," "left," "right" or the like is only used to describe a relative positional relationship, and when an absolute position of the described object is changed, the relative positional relationship is also changed accordingly.

For example, the array substrate according to an embodiment of the invention comprises a plurality of gate lines and a plurality of data lines, and these gate lines and data lines intersect each other to thereby define a plurality of pixel units arranged in a matrix, each of which comprises a thin film transistor functioning as a switching element and a pixel electrode for controlling alignment of liquid crystals. For instance, for the thin film transistor of each pixel unit, its gate electrode is electrically connected to or integrally formed with the respective gate line, its source electrode is electrically connected to or integrally formed with the respective data line, and its drain electrode is electrically connected to or integrally formed with the respective pixel electrode. The following descriptions are mainly made on a single pixel unit or pixel units, but other pixel unit(s) can be formed in the same way.

Embodiment 1

A manufacturing process of an array substrate according to the embodiment is described specifically as follows.

Figure 1:
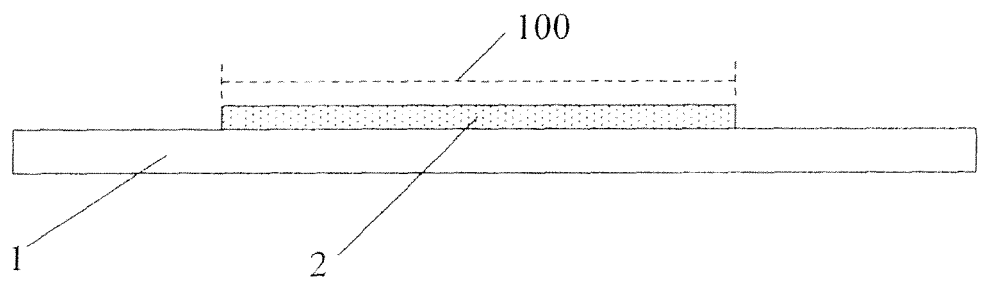
FIG. 1 is a cross-sectional view showing formation of the pattern of an oxide semiconductor layer on a glass substrate in a manufacturing method of an array substrate according to embodiment 1 of the invention.

Firstly, an oxide semiconductor layer pattern 2 is formed on a glass substrate 1. The glass substrate 1 is an example of the substrate working as a base, and may be replaced by other available substrate, such as a quartz substrate, a plastic substrate, or the like. FIG. 1 is a cross-sectional view showing formation of the oxide semiconductor layer pattern 2 on the glass substrate 1. For example, an oxide semiconductor thin film is deposited on the glass substrate 1, the material of the oxide semiconductor may be IGZO or ZnO, and its thickness is in the range of 10-5000Å for example; photoresist is coated on the oxide semiconductor thin film, and is subjected to an exposure process with a mask plate and development treatment, and the photoresist in the region 100 of the semiconductor layer pattern is retained; the exposed oxide semiconductor thin film is etched off, and then the remaining photoresist is removed so as to form the oxide semiconductor layer pattern 2.

Figure 2:
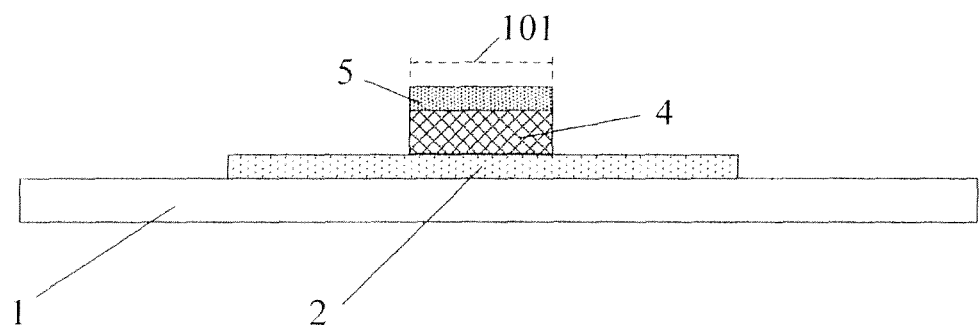
FIG. 2 is a cross-sectional view showing formation of the pattern of a gate insulating layer and a gate electrode on the substrate subsequent to FIG. 1.

Secondly, a gate insulating layer pattern 4 and a gate electrode pattern 5 are formed on the oxide semiconductor layer pattern 2. FIG. 2 is a cross-sectional view showing formation of the gate insulating layer pattern 4 and the gate electrode pattern 5 (a gate line and the gate electrode are formed simultaneously, and the gate line is not shown in the figure); for example, an insulating thin film and a gate metal thin film are sequentially deposited on the substrate with the oxide semiconductor layer pattern 2 formed thereon, the material for the insulating thin film may be silicon nitride, silicon oxide, aluminum oxide, or the like, the material for the gate metal may be a metal such as aluminum, copper, etc. or an alloy of a metal such as aluminum, neodymium, etc., and the thickness of the insulating thin film may be in the range of 200-20000Å; photoresist is coated on the gate metal thin film, and is subjected to an exposure process with a mask plate and development treatment so as to retain the photoresist in a region 101 of the gate insulating layer pattern, the gate electrode pattern and the gate line pattern; the exposed gate metal thin film is etched off, and as the metal is generally etched by wet-etching with an acid reagent, the insulating thin film is exposed after the wet-etching process; the exposed insulating thin film is etched off by dry etching, and then the retained photoresist is removed so as to form the gate insulating layer pattern 4, the gate electrode pattern 5 and the gate line pattern. Because the material of the oxide semiconductor is IGZO or ZnO, which is susceptible to an etching solution, the above etching process is performed by two separate steps of wet etching and dry etching.

Figure 3:
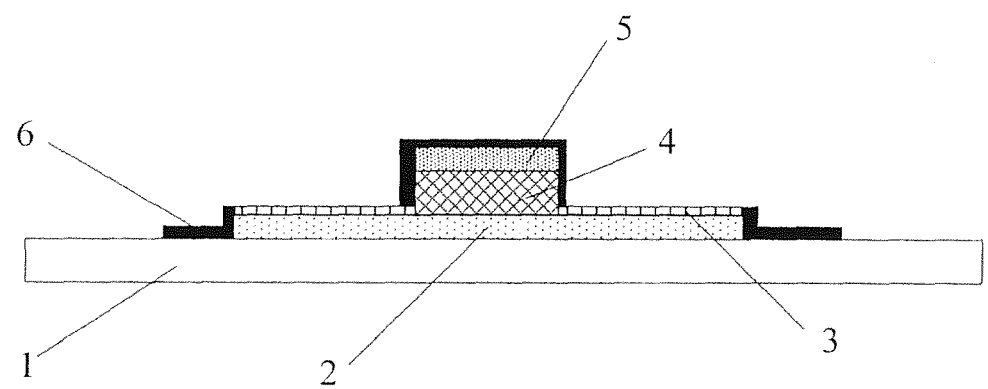
FIG. 3 is a cross-sectional view showing formation of a metal diffusion layer and a barrier layer on the substrate subsequent to FIG. 2.

Next, a metal diffusion layer and a barrier layer are formed, as shown in FIG. 3. A layer of metal thin film, which is an Al thin film in this embodiment, and the thickness of which may be in the range of 20-200Å, is deposited by sputtering; for example, the resultant metal thin film is annealed in an oxygen atmosphere at a temperature of 100-400 centigrade (° C.) for a time period of 20 min to 200 min, so that the Al film directly covering the IGZO or ZnO oxide semiconductor layer pattern 2 diffuses into the oxide semiconductor layer pattern 2 to form a metal Al diffusion layer 3, and the Al thin film which does not directly cover the oxide semiconductor layer pattern 2 is formed to be a Al2O3 barrier layer 6 in the annealing process. As shown in FIG. 3, on all of the gate insulating layer pattern 4, the gate electrode pattern 5 and the glass substrate 1, there is formed one Al2O3 layer 6, which is a compact protective layer capable of preventing degradation of an oxide semiconductor (such as IGZO) effectively.

Figure 4:
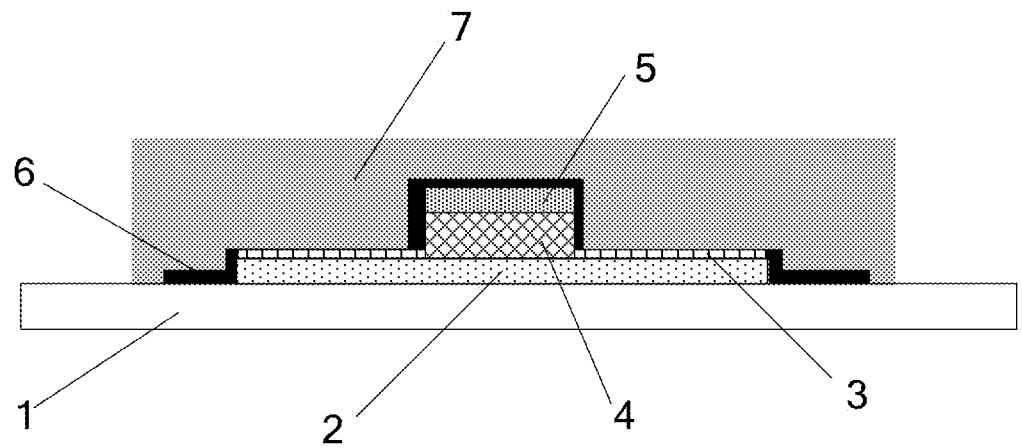
FIG. 4 is a cross-sectional view showing formation of a passivation layer on the substrate subsequent to FIG. 3.

Subsequently, a passivation layer 7 is formed, which can be conducted by coating a layer of material for forming the passivation layer 7 (such as spin-coating) on the substrate to cover the patterns formed in the foregoing three steps. FIG. 4 is a cross-sectional view showing formation of the passivation layer 7, the material for the passivation layer 7 in this embodiment is acrylate.

After formation of the passivation layer 7, the pattern of via holes, source and drain electrodes, a data line and a pixel electrode is formed on the passivation layer 7, and the formation process is described as follows.

Figure 5:
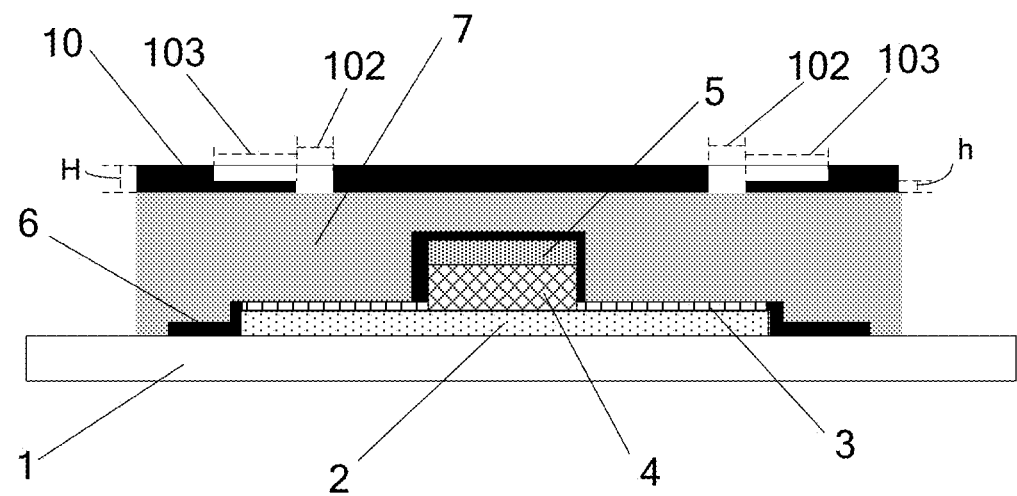
FIG. 5 is a cross-sectional view before via holes are formed in the passivation layer in FIG. 4 and after a photoresist is subjected to exposure and development.
Figure 6:
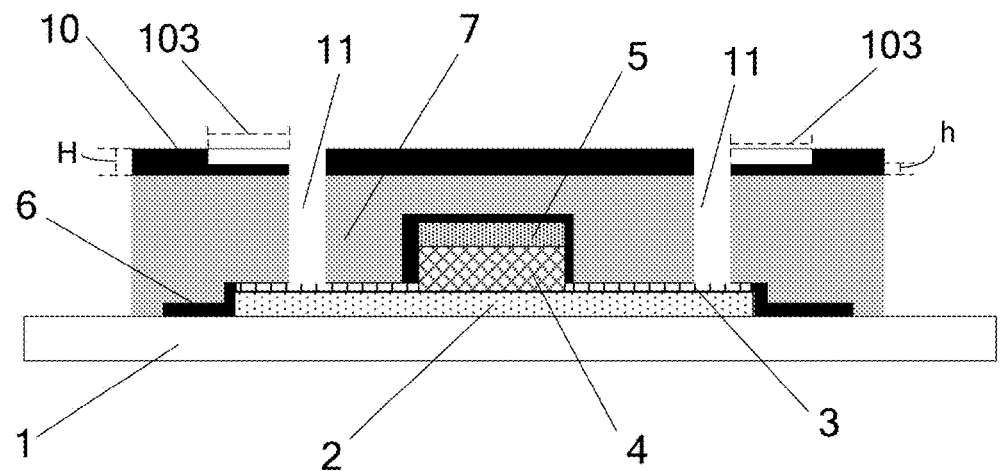
FIG. 6 is a cross-sectional view showing formation of the pattern of the via holes subsequent to FIG. 5.
Figure 7:
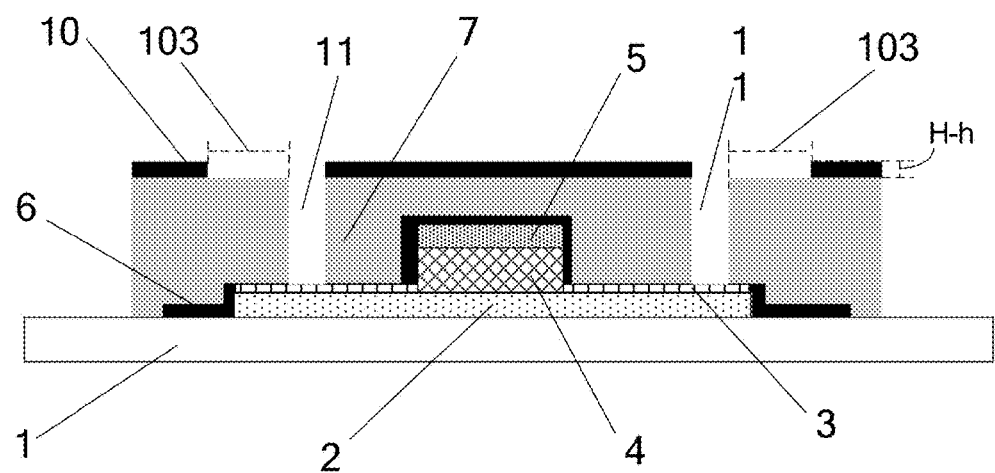
FIG. 7 is a cross-sectional view showing exposure of a region of the pattern of source and drain electrodes by means of conducting an ashing treatment on the photoresist subsequent to FIG. 6.
Figure 8:
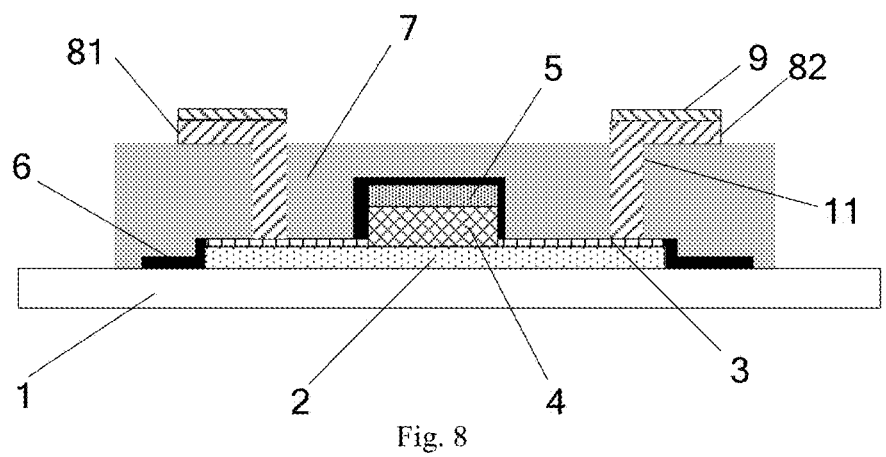
FIG. 8 is a cross-sectional view showing formation of the pattern of the source and drain electrodes and the pixel electrode subsequent to FIG. 7.

As shown in FIG. 5, a layer of photoresist 10 with a thickness of H is coated on the passivation layer 7; after it is exposed and developed through a double tone mask plate (a half-tone mask plate or a grey-tone mask plate), the photoresist in via hole regions 102 is fully developed and removed, and the thickness of the photoresist in source and drain electrode pattern regions 103 is h (which is smaller than H); as shown in FIG. 6, a dry etching is conducted in the via hole regions 102 so as to form via holes 11, and all passivation layer exposed in the via hole regions 12 is etched off upon etching of the via holes 11, so that the metal Al diffusion layers 3 in the via hole regions 102 are exposed; as shown in FIG. 7, the photoresist in the source and drain electrode pattern regions 103 is removed through an ashing process, and the photoresist with a certain thickness (H-h) is still left in other regions on the passivation layer 7 than the via holes 11 and the source and drain electrode pattern regions 103, as shown in FIG. 8, a source and drain metal thin film and a pixel electrode thin film are deposited in sequence so that the source and drain metal thin film contacts with the metal Al diffusion layers 3 through the via holes 11, the material for the source and drain metal thin film may be a metal such as aluminum, copper, gold, silver, or the like, or an alloy of a metal such as aluminum, neodymium, or the like, and the material for the pixel electrode thin film may be ITO, IZO, or other transparent conductive material; the remaining photoresist and the source and drain metal thin film and the pixel electrode thin film attached onto the photoresist are removed by means of lifting-off, and the source and drain metal thin film and the pixel electrode thin film which have been deposited in the source and drain electrode pattern regions 103 are retained, so as to form a pattern of the source and drain electrodes (including a source electrode 81 and a drain electrode 82), a pattern of the data line (not shown in the figure) and a pattern 9 of the pixel electrode. Eventually, the array substrate shown in FIG. 8 is formed.

The array substrate manufactured by using the method according to the embodiment can be, for example, applied widely to an LCD display panel and an OLED display panel. When it is applied to an OILED display panel, the pixel electrode pattern 9 is connected to an anode of an OLED.

Three patterning (or mask) processes in total are used in the above process of manufacturing the array substrate according to the present invention, and as compared to a conventional manufacturing process in which more than four masks are used, the process flow is simplified, and the process costs are reduced. Furthermore, aluminum oxide is used to form the barrier layer of the oxide semiconductor, and stability of TFE's is enhanced effectively.

Embodiment 2

In the embodiment, there is provided another manufacturing method of the above array substrate, details being as follows.

Figure 9:
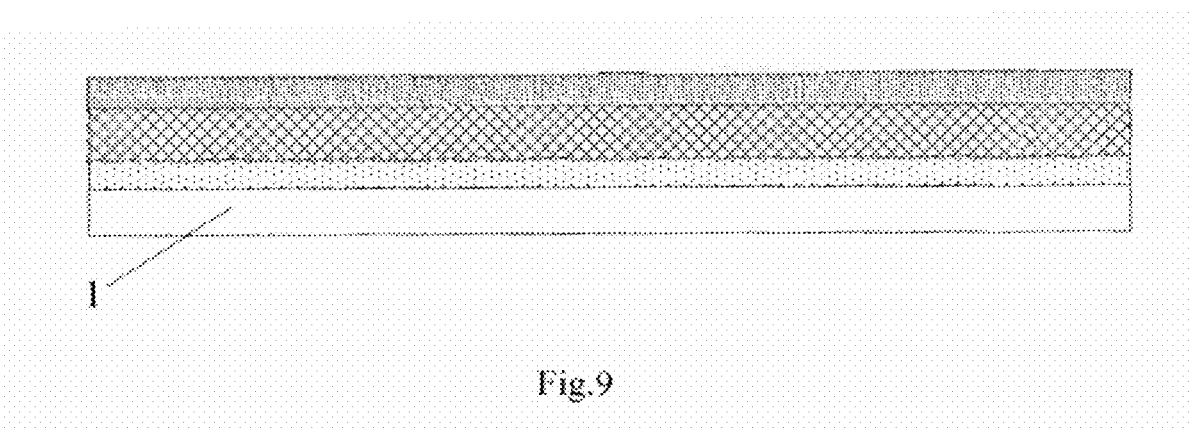
FIG. 9 is a cross-sectional view showing formation of an oxide semiconductor thin film, an insulating thin film and a gate metal thin film on a glass substrate in a manufacturing method of an array substrate according to embodiment 2 of the invention.

As shown in FIG. 9, an oxide semiconductor thin film, an insulating thin film and a gate metal thin film are sequentially deposited on a glass substrate 1. The glass substrate 1 is an example of the substrate working as a base, and may be replaced by other available substrate, such as a quartz substrate, a plastic substrate, or the like. The material for the oxide semiconductor thin film may be IGZO or ZnO, and its thickness is in the range of 10-5000Å. The material for the insulating thin film may be silicon nitride, silicon oxide, aluminum oxide, or the like, the material of the gate metal may be a metal such as aluminum, copper, or the like, or an alloy of a metal such as aluminum, neodymium, or the like, and the thickness of the insulating thin film is in the range of 200-20000Å.

Figure 10:
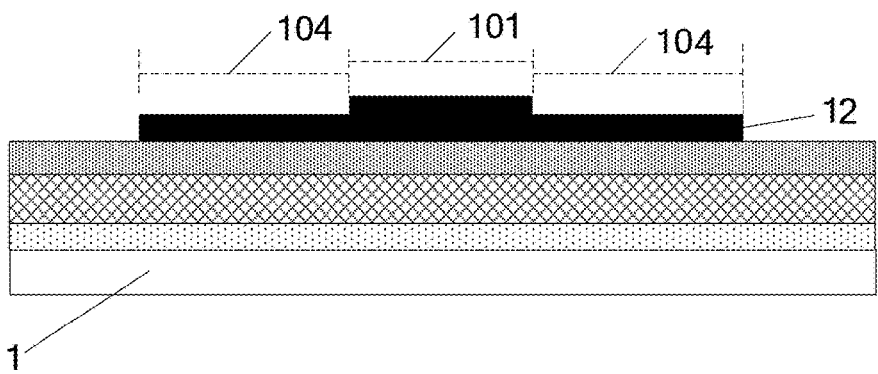
FIG. 10 is a cross-sectional view after photoresist is coated on the substrate subsequent to FIG. 9 and is exposed and developed through a double tone mask plate.

As shown in FIG. 10, photoresist 12 is coated on the gate metal thin film, and is subjected to an exposure and development treatment with a double tone mask (a half-tone mask or a grey-tone mask), so that the photoresist 12 in a region 104 of the pattern of a metal diffusion layer and a region 101 of the pattern of an gate insulating layer, a gate electrode and a gate line is retained, and the thickness of the photoresist 12 in the region 104 of the pattern of the metal diffusion layer is smaller than that of the photoresist 12 corresponding to the region of the pattern of the gate insulating layer, the gate electrode and the gate line, and the remaining photoresist is removed.

Figure 11:
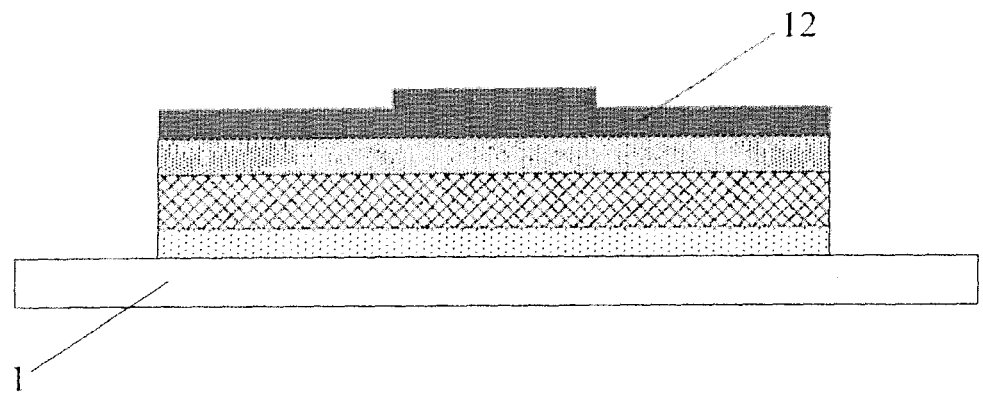
FIG. 11 is a cross-sectional view after the oxide semiconductor thin film, the insulating thin film and the gate metal thin film that are not covered by the photoresist are etched off on the basis of FIG. 10.

The gate metal thin film, the insulating thin film and the oxide semiconductor thin film in the region without the photoresist 12 are etched off through wet etching, dry etching and wet etching processes in sequence, and FIG. 11 shows the configuration after etching.

Figure 12:
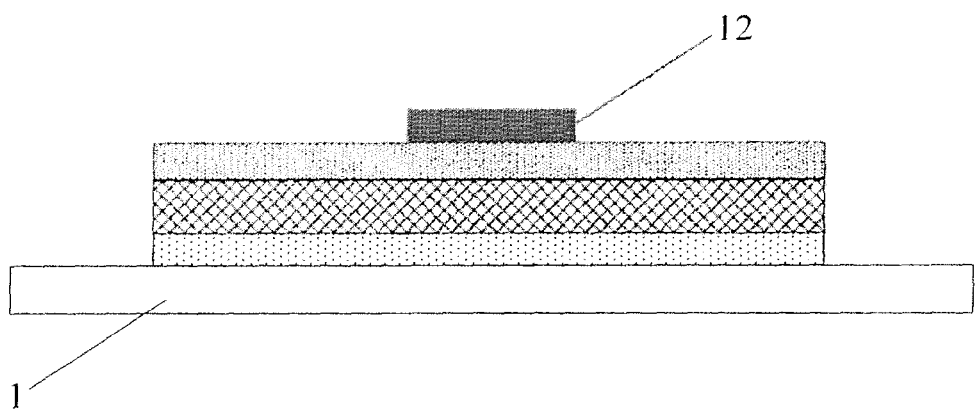
FIG. 12 is a cross-sectional view after an ashing process is conducted so as to merely retain the photoresist in a region of the pattern of a gate insulating layer, a gate electrode and a gate line on the basis of FIG. 11.

As shown in FIG. 12, through an ashing process, the photoresist 12 in the region 101 of the pattern of the gate insulating layer, the gate electrode and the gate line is retained, and the photoresist 12 in the remaining regions is removed.

The gate metal thin film and the insulating thin film in the region where the photoresist 12 is removed are removed through wet etching and dry etching in sequence, and then the retained photoresist 12 is removed so as to form the pattern of the semiconductor layer, the gate insulating layer, the gate electrode and the gate line. FIG. 12 is a schematically cross-sectional view showing formation of the pattern of the semiconductor layer 2, the gate insulating layer 4, the gate electrode 5 and the gate line (not shown in the figure) on the glass substrate 1.

Figure 13:
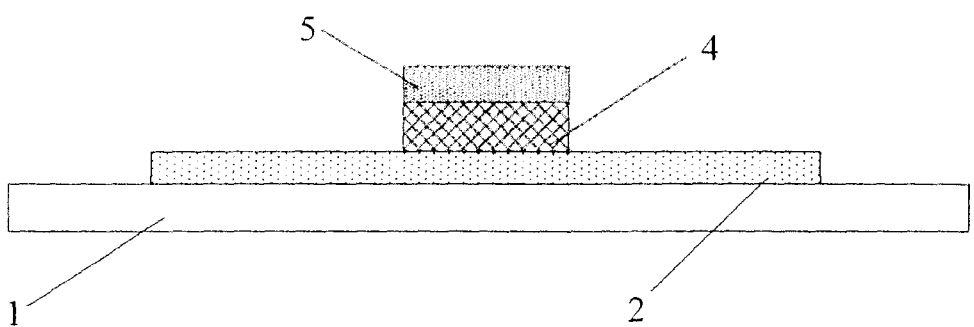
FIG. 13 is a cross-sectional view after the insulating thin film and the gate metal thin film that are not covered by the photoresist are etched off and the remaining photoresist is removed on the basis of FIG. 12.

After formation of the layered structure as shown in FIG. 13 (FIG. 2 in Embodiment 1), the subsequent manufacturing processes are the same as those of Embodiment 1, details being omitted here.

In the embodiment, only one mask plate is used in the process of manufacturing the pattern of the semiconductor layer 2, the gate insulating layer 4, the gate electrode 5 and the gate line (not shown in the figure) on the glass substrate 1, only two mask plates are used in the whole manufacturing process, and as compared to Embodiment 1, the process flow is decreased further, and the process costs is reduced further.

In the above Embodiment 1 and Embodiment 2, a positive or negative type of photoresist may be used for the photoresist.

The constituents of the etching solution for etching the oxide semiconductor may include:

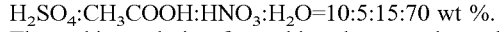
$H_2SO_4:CH_3COOH:HNO_3:H_2O=10:5:15:70$ wt %.

The etching solution for etching the gate electrode may mainly include:

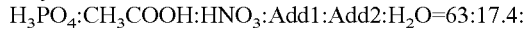
$H_3PO_4:CH_3COOH:HNO_3:Add1:Add2:H_2O=63:17.4:4.5:1:0.1:14$ wt %

The proportions are not merely limited to the above ones. Add1 and Add2 refer to added reagents, the etching solution for the oxide semiconductor will not cause corrosion of the gate electrode, and the etching solution for the gate metal will also not cause corrosion of the oxide semiconductor.

Embodiment 3

According to this embodiment, there is provided an array substrate, which may be fabricated by the method according to the above Embodiment 1 or Embodiment 2. Its structure comprises: a semiconductor layer 2, a gate insulating layer 4, a gate electrode 5, a barrier layer 6, a passivation layer 7, source and drain electrodes 8, and a pixel electrode 9 which are formed on a glass substrate 1, as shown in FIG. 8.

The gate insulating layer 4 and the gate electrode 5 are formed on the semiconductor layer 2 in sequence. The gate insulating layer 4 and the gate electrode 5 are located in the middle position of the semiconductor layer 2 and have a uniform shape and size. In the region on the semiconductor layer 2 which is not covered by the gate insulating layer 4, there is further provided a metal diffusion layer 3. The formation process is that, a layer of metal thin film, preferably Al (as Al has a better diffusivity and a dense protective layer can be formed after it is oxidized), is deposited on the semiconductor layer 2. Al is oxidized, so that the Al film on the surface of the semiconductor layer 2 diffuses into the oxide semiconductor layer 2 to form the metal Al diffusion layer 3, and the Al thin film which does not directly cover the oxide semiconductor layer pattern 2 is formed to be an Al2O3 barrier layer 6 in the oxidization annealing, the barrier layer 6 is located around the semiconductor layer 2 and covers the gate insulating layer 4 and the gate electrode 5 so as to protect the semiconductor layer 2 from being degraded as described in Embodiment 1 or Embodiment 2. Because the Al film is also deposited on the surfaces of the gate insulating layer 4 and the gate electrode 5, after the oxidization annealing, the surfaces of the gate insulating layer 4 and the gate electrode 5 are also covered by the barrier layer of Al2O3.

The passivation layer 7 covers the semiconductor layer 2, the gate insulating layer 4, the gate electrode 5 and the barrier layer 6 (including barrier layer around the semiconductor layer 2 and on the surfaces of the gate insulating layer 4 and the gate electrode 5), the source and drain electrodes 8 are connected to the metal Al diffusion layers 3, and the pixel electrode 9 contacts with the drain electrode. In the embodiment, because of the above special manufacturing process, the source and drain electrodes (including a source electrode 81 and a drain electrode 82) are located on the passivation layer 7, and are connected to the metal Al diffusion layer 3 through via holes 11 in the passivation layer. Specifically, the source electrode 81 and the drain electrode 82 are connected to the metal diffusion layer 3 located at two end portions of the semiconductor layer 2, respectively.

In the embodiment, in addition to common semiconductor materials, the semiconductor layer is preferably of a metal oxide semiconductor, such as IGZO, etc. The barrier layer may be of the above-mentioned Al2O3 or other nonconductive metal oxide, and furthermore may also be of other nonconductive material.

The array substrate fabricated by using the method according to Embodiment 1 or 2 has the advantage of low costs. Regarding the array substrate provided by the embodiment, as an oxide (such as aluminum oxide) is used for the barrier layer of the oxide semiconductor, stability of TFTs can be enhanced effectively.

Embodiment 4

In the present embodiment, there is provided a display device, comprising the array substrate in Embodiment 3. The display device may be a liquid crystal panel, an electronic paper, an OLED panel, a liquid crystal television, a liquid crystal display, a digital photo frame, a cell phone, a tablet computer, or any other product or component having a display function.

The foregoing are merely exemplary embodiments of the present invention, but are not used to limit the protection scope of the invention. The protection scope of the invention is defined by the attached claims.

The invention claimed is:

1. An array substrate, comprising a semiconductor layer, a gate insulating layer, a gate electrode, a barrier layer, a passivation layer, source and drain electrodes, and a pixel electrode, which are all formed on a substrate,
    wherein the gate insulating layer and the gate electrode are formed on the semiconductor layer in sequence, the gate insulating layer and the gate electrode are located in a middle position of the semiconductor layer and have a uniform shape and size; in a region on the semiconductor layer that is not covered by the gate insulating layer, there is further provided a metal diffusion layer, the barrier layer includes a portion covering the gate insulating layer and the gate electrode and a portion located around the semiconductor layer, the passivation layer covers the semiconductor layer, the gate insulating layer, the gate electrode and the barrier layer, the source and drain electrodes are connected to the metal diffusion layer respectively, and the pixel electrode contacts with the drain electrode.

2. The array substrate claimed as claim 1, wherein the source and drain electrodes are located on the passivation layer, and connected to the metal diffusion layer through via holes in the passivation layer.

3. The array substrate claimed as claim 1, wherein the semiconductor layer is a metal oxide semiconductor.

4. The array substrate claimed as claim 1, wherein the metal diffusion layer is an Al diffusion layer.

5. The array substrate claimed as claim 1, wherein the barrier layer is a nonconductive metal oxide.

6. The array substrate claimed as claim 5, wherein the metal oxide is $Al_2O_3$.

7. A display device, comprising the array substrate claimed as claim 1.

* * * * *